United States Patent [19]
Kelkar et al.

[11] Patent Number: 5,656,977
[45] Date of Patent: Aug. 12, 1997

[54] FREQUENCY-LOCK INDICATOR CIRCUIT WITH FREQUENCY-ONLY DETECTION

[75] Inventors: Ram Kelkar, So. Burlington; Ilya Iosephovich Novof, Essex Junction, both of Vt.

[73] Assignee: International Business Machines Corporation, Armonk, N.Y.

[21] Appl. No.: 587,810

[22] Filed: Jan. 5, 1996

[51] Int. Cl.⁶ ................................................. H03L 7/095
[52] U.S. Cl. ................................. 331/25; 331/DIG. 2
[58] Field of Search ............................ 331/DIG. 2, 25

[56] References Cited

U.S. PATENT DOCUMENTS

| | | | |
|---|---|---|---|
| 4,617,520 | 10/1986 | Levine | 328/133 |
| 4,866,402 | 9/1989 | Black | 331/1 A |
| 4,885,553 | 12/1989 | Hietala et al. | 331/17 |
| 5,008,635 | 4/1991 | Hanke et al. | 331/1 A |
| 5,220,295 | 6/1993 | Glover et al. | 331/25 |
| 5,256,989 | 10/1993 | Parker et al. | 331/1 A |
| 5,483,558 | 1/1996 | Leon et al. | 375/376 |
| 5,530,383 | 6/1996 | May | 327/39 |
| 5,546,052 | 8/1996 | Austin et al. | 331/1 A |

Primary Examiner—Robert Pascal
Assistant Examiner—An T. Luu
Attorney, Agent, or Firm—Schmeiser, Olsen & Watts; Robert A. Walsh

[57] ABSTRACT

A frequency-lock indicator circuit is disclosed that compares first and second clock signals and indicates when the signals have the same frequencies for a consecutive number of times. The circuit includes a Frequency-Only Detector (FOD) which is immune to phase differences. The frequencies of the clock signals are compared through counters that will reset each other if a consecutive number of frequencies from the clock signals do not occur at the same time. Then, when a consecutive number of equal frequencies has occurred, a first pulse signal is generated, which in turn produces a lock indication signal, indicating that the first clock signal has the same frequency as the second clock signal, regardless of whether or not the phases of the clock signals are equal. The lock indicator circuit can be used in any PLL circuit regardless of the specific Frequency/Phase Detector used. The circuit can also be used in any application or circuit where two clocks need to be tracked. In addition, the FOD includes a loss of input clock feature that indicates if the input clock is lost.

12 Claims, 3 Drawing Sheets

FREQUENCY-LOCK INDICATOR CIRCUIT WITH FREQUENCY-ONLY DETECTION

BACKGROUND OF THE INVENTION

1. Technical Field

The invention relates generally to lock indicator circuits for timing circuits and, more specifically, to frequency-lock indicator circuits used with Phase-Lock Loop or similar oscillation circuits.

2. Background Art

Many different devices need circuits that tracks two clocks and provide an indication when the two are in-phase or have the same frequency. One example of such a circuit is the Phase-Lock Loop (PLL) circuit, which produces an output clock that operates substantially at the same frequency and phase as the input clock. PLL circuits are commonly used in timing applications such as clock generation, clock extraction and synchronizing chip-to-chip communications.

Lock detection circuitry is used with PLL circuits to indicate when the input and output clocks of the PLL circuit are in a locked position, that is, when the frequency or the phase of an output signal matches the frequency or the phase of an input signal. Most lock detection circuitry deal specifically with indicating when both the phases and the frequency of the circuitry are in locked position.

U.S. Pat. No. 5,008,635, "Phase-Lock-Loop Lock Indicator Circuit," (issued April 1991 to Hanke et al. and assigned to Motorola, Inc.), which is hereby incorporated by reference, discloses a lock detection circuit used for indicating when two clocks have the same frequency and phase in a PLL circuit. The PLL circuit includes a Frequency/Phase Detector device that produces output up and down pulse signals. The number of successive logic high output up and down pulse signals are then counted to generate a lock/unlock detector signal. Consequently, using the signals from the Frequency/Phase Detector in the PLL loop limits the lock detector circuit in that it works only with this specific PLL circuit. Furthermore, because both the frequency and the phase of the signals in this reference need to be basically equal before the locked condition is indicated, systems that only need the output and input clocks to be at the same frequency will have to wait longer while their phases align. Hence, the system's performance is degraded.

Examples of similar lock detection circuits may be found in the following United States Patents, which are hereby incorporated by reference: U.S. Pat. No. 4,617,520, "Digital Lock Detector for a Phase-Locked Loop," (issued October 1986 to Levine and assigned to Motorola, Inc.); U.S. Pat. No. 4,866,402, "System to Verify Phase Lock of a Phase Lock Loop," (issued September 1989 to Black and assigned to TI, Inc.); U.S. Pat. No. 4,885,553, "Continuously Adaptive Phase Locked Loop Synthesizer," (issued December 1989 to Hietala et al. and assigned to Motorola Inc.); and U.S. Pat. No. 5,256,989, "Lock Detection for a Phase Lock Loop," (issued October 1993 to Parker et al. and assigned to Motorola, Inc.).

Although the aforementioned patents provide a lock circuit to indicate when the PLL clock signals are in-phase, the signals that are inputted into the lock indicator circuit are usually input at a predetermined frequency. The lock circuits do not indicate when the frequency from one clock signal matches the frequency from a second clock signal if those clock signals are out-of-phase. Thus, the circuits are not immune to phase differences. Also, the signals from the Frequency/Phase Detector in the PLL loop are needed for the aforementioned lock detector circuits, thus limiting each lock detector circuit to work only with its specific PLL circuit. Furthermore, when the signals from the PLL Frequency/Phase Detector are used in the lock detector circuit design, an undesirable loading and/or noise level may affect the operation of the PLL circuit.

Accordingly, a need has developed in the art for a lock indicator circuit that is immune to phase differences, and can be used with any PLL circuit regardless of the specific Frequency/Phase Detector used for that PLL circuit.

SUMMARY OF THE INVENTION

It is thus an advantage of the present invention to provide a circuit such as a PLL circuit with lock detection circuitry that indicates when two clock signals are of the same frequency even when the compared signals are at different phases.

It is a further advantage of the present invention to provide a lock detection circuit that is independent of Frequency/Phase Detector signals used within a PLL loop, and only needs the compared clock signals for reliable indication of a locked condition.

It is yet a further advantage of the present invention to provide a lock detection circuit that is tolerant to small fluctuations in the frequency.

The foregoing and other advantages of the invention are realized by a circuit that compares two clock signals and indicating when the signals are of the same frequency. The circuit includes an input device, pattern repeatability circuit, pattern discontinuity circuit, and latch device.

The input device inputs a first clock pulse having a first phase and a first frequency, and a second clock pulse having a second phase and a second frequency. The pattern repeatability circuit, which is coupled to the input device, generates a first pulse signal when the first and second frequencies of the clock signals have been essentially equal a consecutive number of times. This indicates that the first clock signal has the same frequency as the second clock signal, regardless of whether or not the phases of the clock signals are equal. The pattern discontinuity circuit will detect if the pattern established previously is discontinued, and if so, will inhibit the pattern repeatability circuit from issuing the first pulse signal. The latch device will then generate a lock indication signal when the first pulse signal has occurred.

Each lock indicator circuit can thus be used in any PLL circuit regardless of the specific Frequency/Phase Detector used, and can be used in any application where two clocks need to be tracked. The circuit is a stand-alone circuit in the sense that it contains all the necessary functions to detect the locked condition of two inputted clocks. Furthermore, an adjustable difference between the lock and unlock counters ensures reliable operation for periodic frequency difference, which can occur during normal operation and are corrected by the PLL Frequency/Phase Detector.

In addition, the circuit in accordance with the present invention includes a loss of input clock feature that produces an indication if the input clock is lost.

BRIEF DESCRIPTION OF DRAWINGS

The foregoing and other features and advantage of the invention will be apparent from the following more particular description of the preferred embodiment(s) of the invention, as illustrated in the accompanying drawings.

DETAILED DESCRIPTION OF THE BEST MODE FOR CARRYING OUT THE INVENTION

Figure 1:
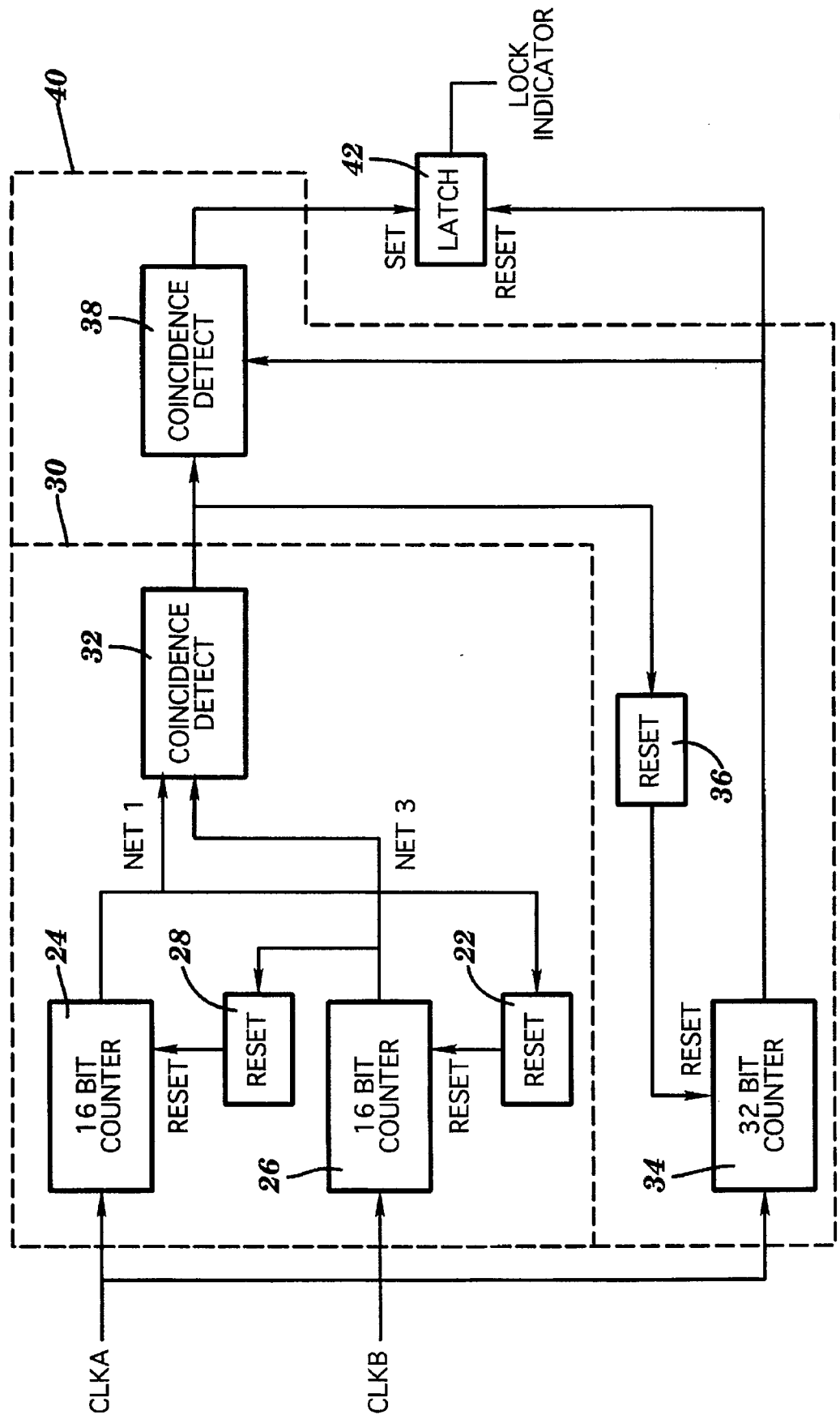
FIG. 1 is a block diagram illustrating the frequency-lock indicator in accordance with a preferred embodiment of the present invention.
Figure 3:
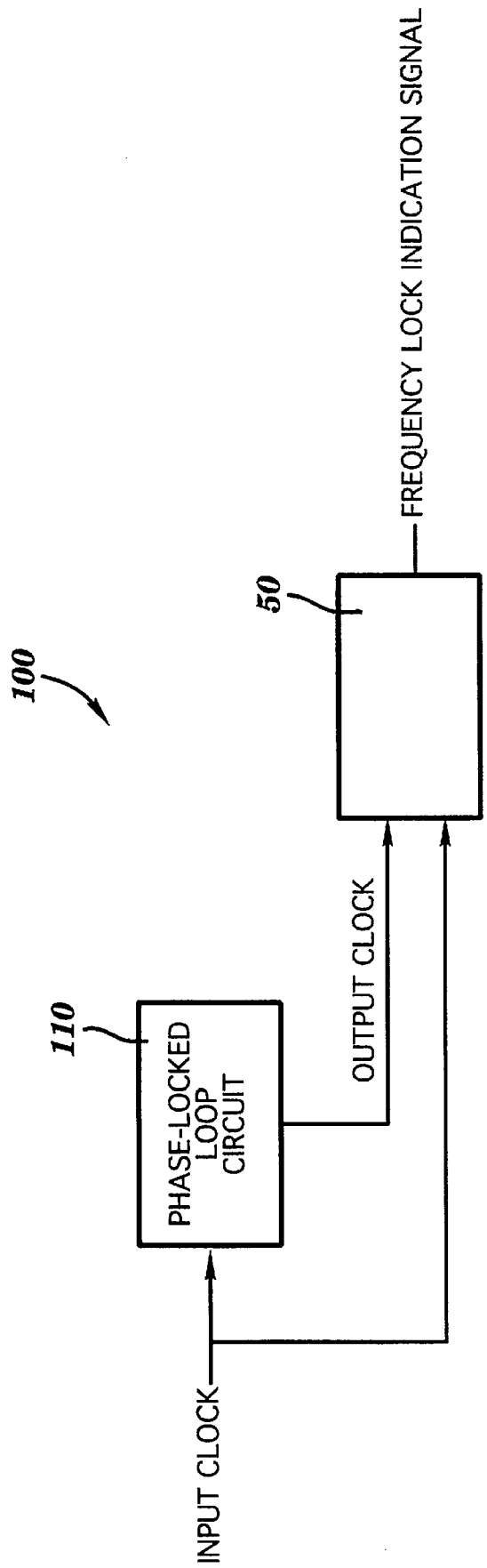
FIG. 3 is a block diagram illustrating the frequency-lock indicator of FIG. 2 used in a PLL system.

With reference to FIG. 1, the block diagram 10 shows a preferred embodiment of the present invention. A first and a second clock signals, CLKA and CLKB, with a first and second phase and frequencies, respectively, are input by an input device such as a clock circuit (e.g. PLL circuit as shown in FIG. 3), network, or any appropriate device into a first and second 16-bit counters 24 and 26, respectively. The first counter 24 is reset through reset device 28 by the falling edge of the output of the second counter 26, and, similarly, the second counter 26 is reset through reset device 22 by the fig edge of the output of the first counter 24. The outputs of the first counter 24 and the second counter 26 are then inputted into a first coincidence detect device 32. The first coincidence detect device 32 generates a first pulse signal when the first and second frequencies of the clock signals have been essentially equal a consecutive number of times. This indicates that the first clock signal CLKA has the same frequency as the second clock signal CLKB, regardless of whether or not the phases of the clock signals are equal. Accordingly, elements 22, 24, 26, 28 and 32 make up the devices for determining a pattern repeatability 30.

The output of the first coincidence detect device 32 is then compared with the output of a 32-bit counter 34 (with CLKA as its input) through a second coincidence detect device 38 to indicate if the pattern established previously is discontinued. The 32-bit counter 34 is reset by the output of the first coincidence detect device 32 through reset device 36. Elements 34, 36 and 38 make up the device for determining pattern discontinuity 40.

The output of the second coincidence detect device 38 is then inputted into a latch 42, which will then indicate a frequency lock for the two clocks CLKA and CLKB. The latch is reset by the 32-bit counter 34.

Figure 2:
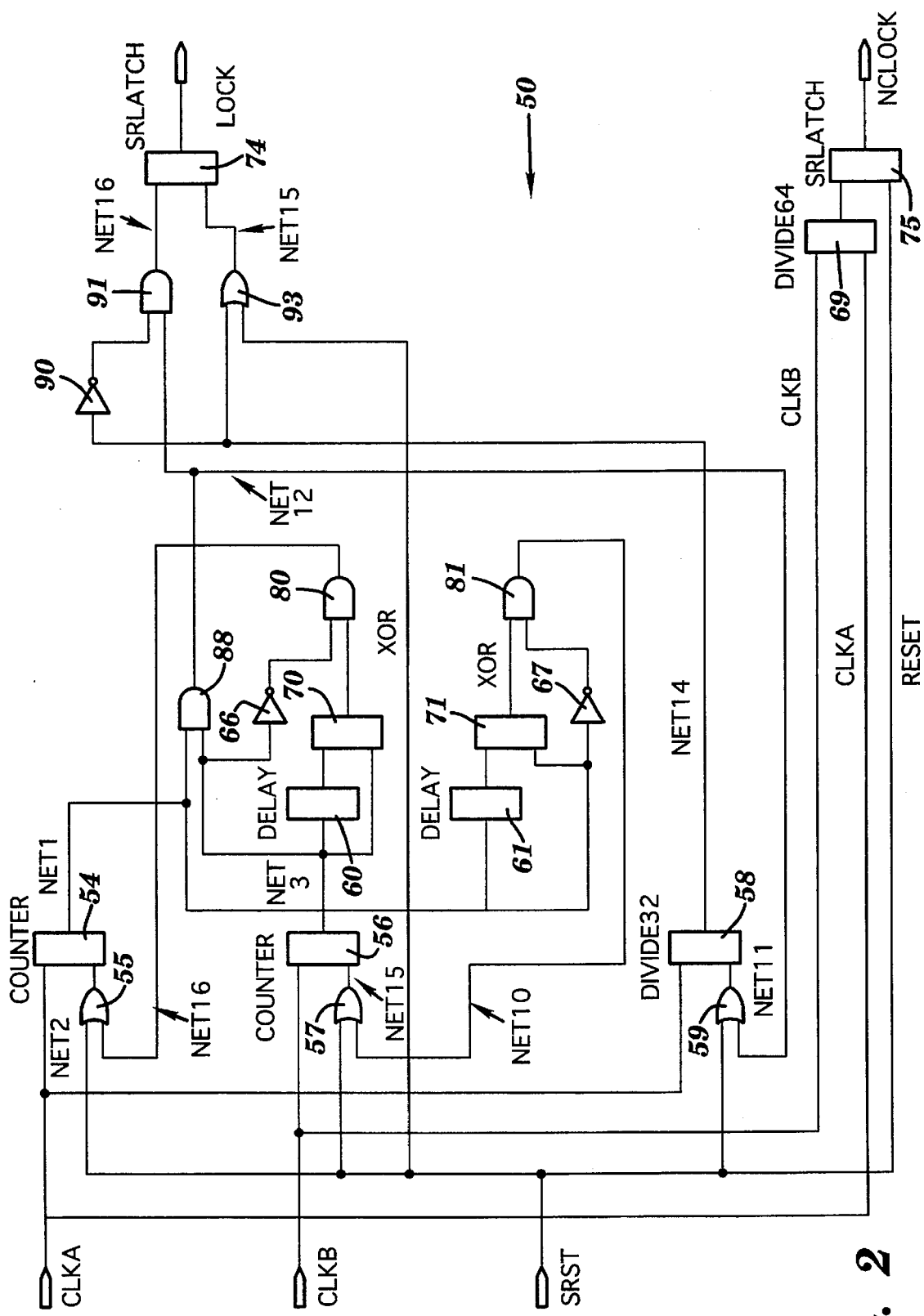
FIG. 2 is a schematic diagram illustrating the block diagram of FIG. 1.

As shown in FIG. 2, the details of the block diagram 10 of FIG. 1 are illustrated through the circuit diagram 50. A first and second clock, CLKA and CLKB are input into first and second 16-bit pulse counters, 54 and 56, respectively (corresponding to elements 24 and 26 in FIG. 1). These pulse counters 54 and 56 are used to count a first and second frequency of the first and second clocks. If the frequencies are equal, then the two counters, 54 and 56 will issue simultaneous pulses at their outputs, which being coupled to an AND gate 88 produces a pulse at NET12. NET12 will then set the output latch 74, which in turn will set the LOCK output HIGH. If the two counters 54 and 56 do not agree because the clock frequencies are unequal, then the counter with the higher frequency will reset the other counter; thus, insuring the lock indicator will indicate a locked condition only when the clock signals have the same frequency and are consecutive. Although an AND gate 88 is shown to correspond with the coincidence detect 32 of FIG. 1, other similar devices, such as a latch or a variety of gates, may be used without departing from the scope of the invention.

Only the falling edge of each counter output pulse is used in the resetting action. The falling edge of counter 54 is extracted using delay circuit 61, coupled to XOR circuit 71, which in turn is coupled along with inverter 67 to AND gate 81. Likewise, the falling edge of counter 56 is extracted from delay circuit 60, coupled to XOR circuit 70, which in turn is coupled along with inverter 66 to AND gate 80.

The unlock counter 58 is a 32-bit pulse counter that counts the first clock pulse, CLKA, and is reset by the set pulse at NET12. In the absence of a reset pulse, the unlock counter will reset LOCK to a logical LOW. The counter 58, inverter 90 and AND gate 91 correspond to elements 34 and 38 of FIG. 1. As aforementioned, a latch or similar device or combination thereof may be used in place of any or all AND gates described without departing from the scope of the invention. Similarly, an AND gate or any appropriate combination of gates may be used for a latch device.

The loss-of-input clock condition is detected by the 64-bit pulse counter 69, which is reset by CLKA. Loss of CLKA causes the counter to complete its count, set the output latch 75, which then pulls the NCLOCK (no clock) output LOW. The choice of a 64 pulse counter for the preferred embodiment is dictated by a maximum frequency difference between CLKA and CLKB (e.g. CLKA is 5 MHz minimum and CLKB is 250 MHz maximum, creating a 245 MHz frequency difference).

A system reset (SRST) input is also available to resets all the counters and latches through OR gate 55 (coupled with AND gate 80 to reset counter 54), through OR gate 57 (coupled with AND gate 61 to reset counter 56), through OR gate 59 (coupled with AND gate 88 to reset counter 58), through OR gate 93 (coupled with the output of counter 58 to reset latch 74), and through the latch 75 to reset NCLOCK.

As shown in FIG. 3, the frequency-lock indicator 50 of FIG. 2 is used with a PLL circuit 110 within a PLL system 100. When using the frequency-lock indicator circuit 50 in conjunction with a PLL circuit 110, CLKA would normally be the input clock and CLKB the output clock The PLL Frequency/Phase Detector, which is part of the PLL circuit, would force the two clocks to be in-phase and of the same frequency. As soon as the frequencies of the two clocks are equal for a certain mount of pulses, the lock indicator will produce a lock indicator signal for the PLL circuit. Thus, the lock indicator signal indicates the availability of the output clock, that is, is signals the system that the output clock is now usable. The lock indicator signal can also be used for test purposes to confirm the PLL operation by initiated output frequency sampling.

The circuit in accordance with the present invention allows the detection of a locked condition which is defined as when two clocks are of the same frequency. The circuit is a stand-alone circuit in the sense that it contains all the necessary functions to detect this locked condition. An adjustable difference between the lock and unlock counters ensures reliable operation for periodic frequency differences, which can occur during normal operation and are corrected by the PLL Frequency/Phase Detector.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A lock detection circuit, comprising:
   input means for inputting a first clock signal having a first phase and a first frequency, and a second clock signal having a second phase and a second frequency;
   frequency lock indicator means, coupled to said input means, for generating a frequency lock indication signal when said first frequency is equal to said second frequency regardless of whether said first phase is equal to or different from said second phase; and a loss-of-input clock means, coupled to said first clock signal, for generating a no-clock signal when said first clock signal is absent.

2. The lock detection circuit of claim 1, wherein said frequency lock indicator means further comprises:

a pattern repeatability means, coupled to said input means, for generating a first pulse signal when a consecutive number of said first frequency and said second frequency has occurred simultaneously, indicating said first clock signal to the same frequency as said second clock signal; and latch means, coupled to said pattern repeatability means, for generating said lock indication signal when said first pulse signal has occurred.

3. The circuit of claim 2, further comprising:

pattern discontinuity means, coupled to said pattern repeatability means and said latch means, for resetting said latch means when said first frequency of said first clock signal is different than said second frequency of said second clock signal.

4. The circuit of claim 2, wherein said pattern repeatability means comprises:

a first counter, coupled to said first clock signal, for counting said first frequency to a number and outputting a first frequency pulse when said first counter reaches said number;

a second counter, coupled to said second clock signal, for counting said second frequency to said number and outputting a second frequency pulse when said second counter reaches said number; and a coincidence detect circuit, coupled to said first and second counter, for outputting said first pulse signal when said first and second frequency pulses occur at the same time.

5. A method for indicating when a first frequency of a first clock signal is equal to a second frequency of a second clock signal comprising the steps of:

a) inputting said first clock signal having said first phase and a first frequency;

b) inputting said second clock signal having said second phase and a second frequency;

c) generating a frequency lock indication signal when said first frequency is equal to said second frequency regardless of whether said first frequency is equal to or different from said second frequency; and d) generating a no-clock signal when said first clock signal is absent.

6. The method of claim 5, wherein said generating step further comprises the steps of:

c1) generating a first pulse signal when a consecutive number of said first frequency and said second frequency has occurred simultaneously; and c2) generating said lock indication signal when said first pulse signal has occurred.

7. The method of claim 6, further comprising the steps of:

c4) resetting said frequency lock indication signal to low when said first frequency of said first clock signal is different than said second frequency of said second clock signal.

8. The method of claim 6, wherein said generating a first pulse signal comprises the steps of:

ca) counting said first frequency to a number and outputting a first frequency pulse when said first frequency reaches said number;

cb) counting said second frequency to said number and outputting a second frequency pulse when said second frequency reaches said number; and cc) outputting said first pulse signal when said first and second frequency pulses occur at the same time.

9. A phase-clock loop system having a lock detection circuit, said system comprising:

a phase-lock loop circuit for generating an output clock signal from an inputted input clock signal;

input means, coupled to said phase-lock loop circuit, for inputting said input clock signal having a first phase and a first frequency, and said output clock signal having a second phase and a second frequency;

frequency lock indicator means, coupled to said input means, for generating a frequency lock indication signal when said first frequency is equal to said second frequency regardless of whether said first phase is equal to or different from said second phase; and a loss-of-input clock means, coupled to said input clock signal, for generating a no-clock signal when said input clock signal is absent.

10. The system of claim 9, wherein said frequency lock indication means further comprises:

a pattern repeatability means, coupled to said input means, for generating a first pulse signal when a consecutive number of said first frequency and said second frequency has occurred simultaneously, indicating said input clock signal to the same frequency as said output clock signal; and latch means, coupled to said pattern repeatability means, for generating said lock indication signal when said first pulse signal has occurred.

11. The system of claim 9, further comprising:

pattern discontinuity means, coupled to said pattern repeatability means and said latch means, for resetting said latch means when said first frequency of said input clock signal is different than said second frequency of said output clock signal.

12. The system of claim 10, wherein said pattern repeatability means comprises:

a first counter, coupled to said input clock signal, for counting said first frequency to a number and outputting a first frequency pulse when said first frequency reaches said number;

a second counter, coupled to said output clock signal, for counting said second frequency to said number and outputting a second frequency pulse when said second frequency reaches said number;

a coincidence detect circuit, coupled to said first and second counter, for outputting said first pulse signal when said first and second frequency pulses occur at the same time.

* * * * *

UNITED STATES PATENT AND TRADEMARK OFFICE
CERTIFICATE OF CORRECTION

Page 1 of 1

| | |
|---|---|
| PATENT NO. | : 5,656,977 |
| APPLICATION NO. | : 08/587810 |
| DATED | : August 12, 1997 |
| INVENTOR(S) | : Ram Kelkar and Ilya Iosephovich Novof |

It is certified that error appears in the above-identified patent and that said Letters Patent is hereby corrected as shown below:

In the claims on page 7:
Column 5, line 36, cancel the text beginning with "5. A method for indicating" to and ending "signal is absent." in column 5, line 49, and insert the following claim:

--5. A method for indicating when a first frequency of a first clock signal is equal to a second frequency of a second clock signal comprising the steps of:
  a) inputting said first clock signal having a first phase and said first frequency;
  b) inputting said second clock signal having a second phase and said second frequency;
  c) generating a frequency lock indication signal when said first frequency is equal to said second frequency regardless of whether said first phase is equal to or different from said second phase; and
  d) generating a no-clock signal when said first clock signal is absent.--

Signed and Sealed this
Thirty-first Day of July, 2012

David J. Kappos
*Director of the United States Patent and Trademark Office*